(12) United States Patent
Wojciechowski

(10) Patent No.: US 11,320,087 B2
(45) Date of Patent: May 3, 2022

(54) PORTABLE CASE AND PROTECTIVE SHIELD FOR VIDEO DISPLAY APPARATUS

(71) Applicant: David Wojciechowski, Phoenix, AZ (US)

(72) Inventor: David Wojciechowski, Phoenix, AZ (US)

( * ) Notice: Subject to any disclaimer, the term of this patent is extended or adjusted under 35 U.S.C. 154(b) by 0 days.

(21) Appl. No.: 16/544,700

(22) Filed: Aug. 19, 2019

(65) Prior Publication Data

US 2020/0056737 A1 Feb. 20, 2020

Related U.S. Application Data

(60) Provisional application No. 62/719,350, filed on Aug. 17, 2018.

(51) Int. Cl.

| | |
|---|---|
| *F16M 3/00* | (2006.01) |
| *F16M 11/42* | (2006.01) |
| *F16M 11/20* | (2006.01) |
| *A47B 81/06* | (2006.01) |
| *H05K 7/00* | (2006.01) |
| *F16M 11/24* | (2006.01) |
| *F16M 11/04* | (2006.01) |
| *F16M 11/18* | (2006.01) |
| *H05K 5/00* | (2006.01) |

(52) U.S. Cl.
CPC .......... *F16M 3/00* (2013.01); *F16M 11/2021* (2013.01); *F16M 11/2092* (2013.01); *F16M 11/42* (2013.01); *A47B 81/061* (2013.01); *F16M 11/04* (2013.01); *F16M 11/18* (2013.01); *F16M 11/24* (2013.01); *H05K 5/00* (2013.01); *H05K 7/00* (2013.01)

(58) Field of Classification Search
CPC .. F16M 3/00; F16M 11/2021; F16M 11/2092; F16M 11/42; F16M 11/04; F16M 11/18; F16M 11/24; H05K 5/0004; H05K 7/14; H04K 5/0017; A47B 81/06
See application file for complete search history.

(56) References Cited

U.S. PATENT DOCUMENTS

| | | | |
|---|---|---|---|
| 6,585,214 B1 * | 7/2003 | Dittmer | F16M 11/38 248/370 |
| 6,783,198 B2 | 8/2004 | Rudd et al. | |

(Continued)

FOREIGN PATENT DOCUMENTS

NL  2001945 C  *  9/2008

*Primary Examiner* — Tan Le
(74) *Attorney, Agent, or Firm* — Richard E. Oney; Venjuris, P.C.

(57) ABSTRACT

A portable video display system includes a base container and a display monitor mounted to a display support structure. The display support structure is hingedly coupled to the base container and can be moved between; (i) a closed position wherein at least a portion of the display support structure is stored within the case interior space; and (ii) an open position wherein at least a portion of the display support structure is in a deployed position outside of the case interior space. In the open position, the base container acts as a stand and supports the display support structure in the deployed position. The display support structure is configured to protect a display monitor when the display support structure is in the open position and includes a translucent shield that is positioned over the display monitor.

20 Claims, 11 Drawing Sheets

(56) References Cited

U.S. PATENT DOCUMENTS

| | | | |
|---|---|---|---|
| 7,024,677 B1 | 4/2006 | Snyder et al. | |
| 8,596,728 B2 * | 12/2013 | Rozestraten | A47B 81/061 312/7.2 |
| 9,326,406 B2 * | 4/2016 | Brandt | A45C 9/00 |
| 10,231,795 B1 * | 3/2019 | Johnson | F16M 11/24 |
| 10,401,006 B2 * | 9/2019 | Kennedy | F21V 21/26 |
| 10,827,827 B1 * | 11/2020 | Failing | A47B 21/03 |
| 2003/0135408 A1 | 7/2003 | Snyder | |
| 2003/0161093 A1 * | 8/2003 | Lam | G06F 1/1616 361/679.24 |
| 2005/0137942 A1 * | 6/2005 | LaFleur | G06Q 30/0601 705/26.1 |
| 2009/0091930 A1 * | 4/2009 | Probasco | F21S 8/028 362/235 |
| 2010/0231101 A1 | 9/2010 | Rubin | |

* cited by examiner

PORTABLE CASE AND PROTECTIVE SHIELD FOR VIDEO DISPLAY APPARATUS

RELATED APPLICATION DATA

This application is based on and claims the benefit of U.S. Provisional Patent Application No. 62/719,350 filed on Aug. 17, 2018, the disclosure of which is incorporated herein in its entirety by this reference.

BACKGROUND

This invention relates generally to video display apparatus. More specifically, it relates to a portable case for a video display that protects the display from physical damage when used in an environment such as on the sideline of an athletic event.

Prior art video displays used on the sideline of athletic events, such as for viewing instant replay on the sideline of football games, suffer from a number of disadvantages. Typically, such displays are small and are not suitable for providing sideline instruction to a group of players. Larger video displays are difficult to transport and set up in a stable position for use, and once set up they are subject to potential damage, such as from flying balls leaving the field of play or other sideline hazards. There is a need, therefore for an improved video display system that overcomes these disadvantages.

It is an object of the present invention to provide such a video display system that is easily transportable, that is fully protected, that can be set up for use in a short period of time, and can be used for instructional purposes, such as for reviewing instant replay with a group of players on the sideline during an athletic event or during practice.

Additional objects and advantages of the invention will be set forth in the description that follows, and in part will be apparent from the description, or may be learned by practice of the invention. The objects and advantages of the invention may be realized and obtained by means of the instrumentalities and combinations pointed out in this specification, including the appended claims.

SUMMARY

To achieve the foregoing objects, and in accordance with the purposes of the invention as embodied and broadly described in this document, there is provided a portable case for a video display apparatus. The case includes a base container that defines a case interior space and a display support structure coupled to the base container. The display support structure is configured to be moved between; (i) a closed position wherein at least a portion of the display support structure is stored within the case interior space; and (ii) an open position wherein at least a portion of the display support structure is in a deployed position outside of the case interior space. In the open position, the base container acts as a stand and supports the display support structure in the deployed position. The display support structure is configured to protect a display monitor when the display support structure is in the open position and includes a translucent shield that is positioned over the display monitor. Preferably, the translucent shield is made of a material suitable as a monitor overlay that can be marked with an erasable marker for the purpose of instructing players using instant replay video during an athletic event. The portable case can include wheels mounted to a side of the base container for transporting the case when display support structure is in the closed position.

In some embodiments, the display support structure includes a rear track adapted to slidingly receive a removable panel when the display support structure is in the open position to protect the rear of a display monitor mounted to the display support structure. The display support structure also can have a front track adapted to slidingly receive the removable panel when the display support structure is in the closed position to protect the display monitor and translucent shield during storage and transportation of the video display system.

The case interior space can have one or more storage compartments and the case can be configured to store electronics that can operate with an instant replay system to enable a viewer of the deployed monitor to watch instant replay during an athletic event.

A portable video display system according to the present invention includes a portable case like that described above and a display monitor mounted to the display support structure. Such a portable case provides an easily transportable, protected video system that can be quickly set up to provide a large screen video display that can be used in environments or applications where a video display system is subjected to potential physical damage, such as on the sideline of an athletic event.

BRIEF DESCRIPTION OF THE DRAWINGS

The accompanying drawings and appendices, which are incorporated in and constitute a part of the specification, illustrate the presently preferred embodiments and methods of the invention, and together with the general description given above and the detailed description of the preferred embodiments and methods given below, serve to explain the principles of the invention.

DESCRIPTION

Figure 1:
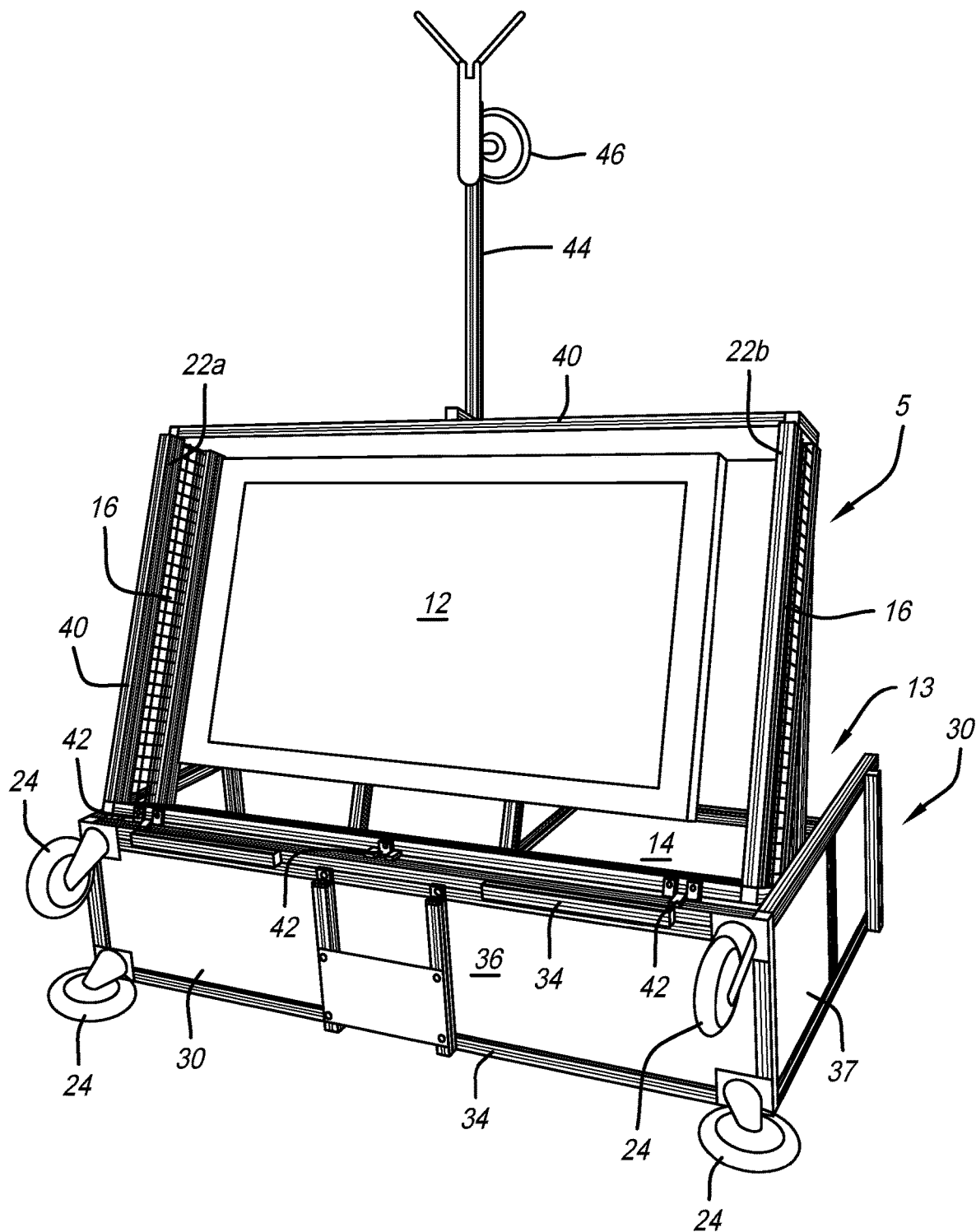
FIG. 1 is a perspective front view of one embodiment of a portable video display system according to the present invention, showing the case in an open position with the display monitor deployed from the case for viewing video.

Reference in this application is made to presently preferred embodiments of the invention. While the invention is described more fully with reference to these examples, the invention in its broader aspects is not limited to the specific details, representative devices, and illustrative examples shown and described. Rather, the description is to be understood as a broad, teaching disclosure directed to persons of ordinary skill in the appropriate arts, and not as limiting upon the invention.

It will be appreciated that terms such as "front," "forward," "rear," "rearward," "upper," "inner," "outer," "vertical," "horizontal," "bottom," "below," "top," "side," "inwardly," "outwardly," "downwardly" and "lower" and other positionally descriptive terms used in this specification are used merely for ease of description and refer to the orientation of the referenced components as shown in the figures. It should be understood that any orientation of the components described herein is within the scope of the present invention.

FIGS. 1-5 illustrate one embodiment of a portable video display system according to the present invention, generally designated as 5. The portable video display system 5 includes a portable case 10 for transporting and protecting a display monitor 12, such as a large screen TV. The portable case 10 includes a generally rectangular base container 30 that has a frame 34 with sidewall panels 36, 37 and a floor panel 38 and that defines a case interior space 32. A display support structure 13 includes a frame 40 that defines an enclosure for protecting the display monitor 12. The display support structure 13 is mounted to the base container frame 34 with hinges 42 so that it can be hingedly moved between: (i) a closed position (shown in FIG. 6) wherein the display monitor 12 is stored within the case interior space 32; and (ii) an open position (shown in FIGS. 1-5) wherein the display monitor 12 is in a deployed position outside of the case interior space 32 and the base container 30 supports the display support structure 13 and monitor 12 in the open, deployed position. In this configuration, the display monitor 12 can be hingedly deployed from the case 10 for viewing video, such as viewing instant replay or other instructional video on the sideline of an athletic event. When the monitor 12 is deployed into the open position (as shown in FIGS. 1-5), the base container 30 acts as a stable stand for supporting the display support structure 13 and the display monitor 12.

In the embodiment of FIGS. 1-6, the display support structure frame 40 has two opposing rear side members 20a, 20b and two opposing front side members 22a, 22b. Each of two opposing side support arms 26a, 26b, is rotatably connected at one end to the base container frame 34 and is releasably connected at the other end to the corresponding rear side member 20a, 20b. Side panels 16a, 16b, which can be cage panels (as shown in FIG. 1-5) or solid panels, are mounted on each side of the display support structure frame 40 between the corresponding front side member 22a, 22b and rear side member 20a, 20b. The display support structure frame 40 also includes an H-shaped portion 52 to which the display monitor 12 is mounted.

Figure 2:
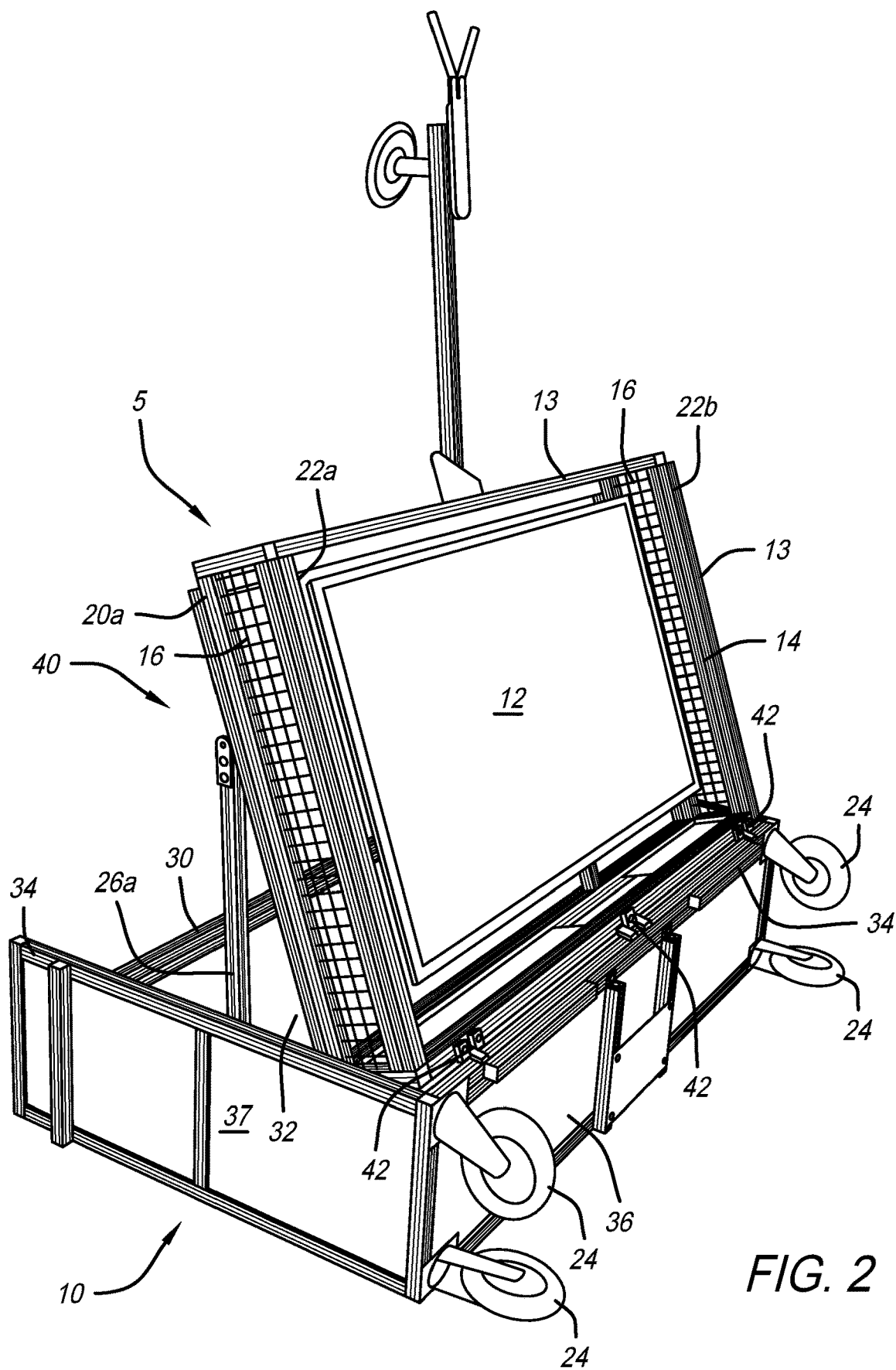
FIG. 2 is a perspective side view of the portable video display system of FIG. 1 showing the case in the open position with the display monitor deployed.
Figure 3:
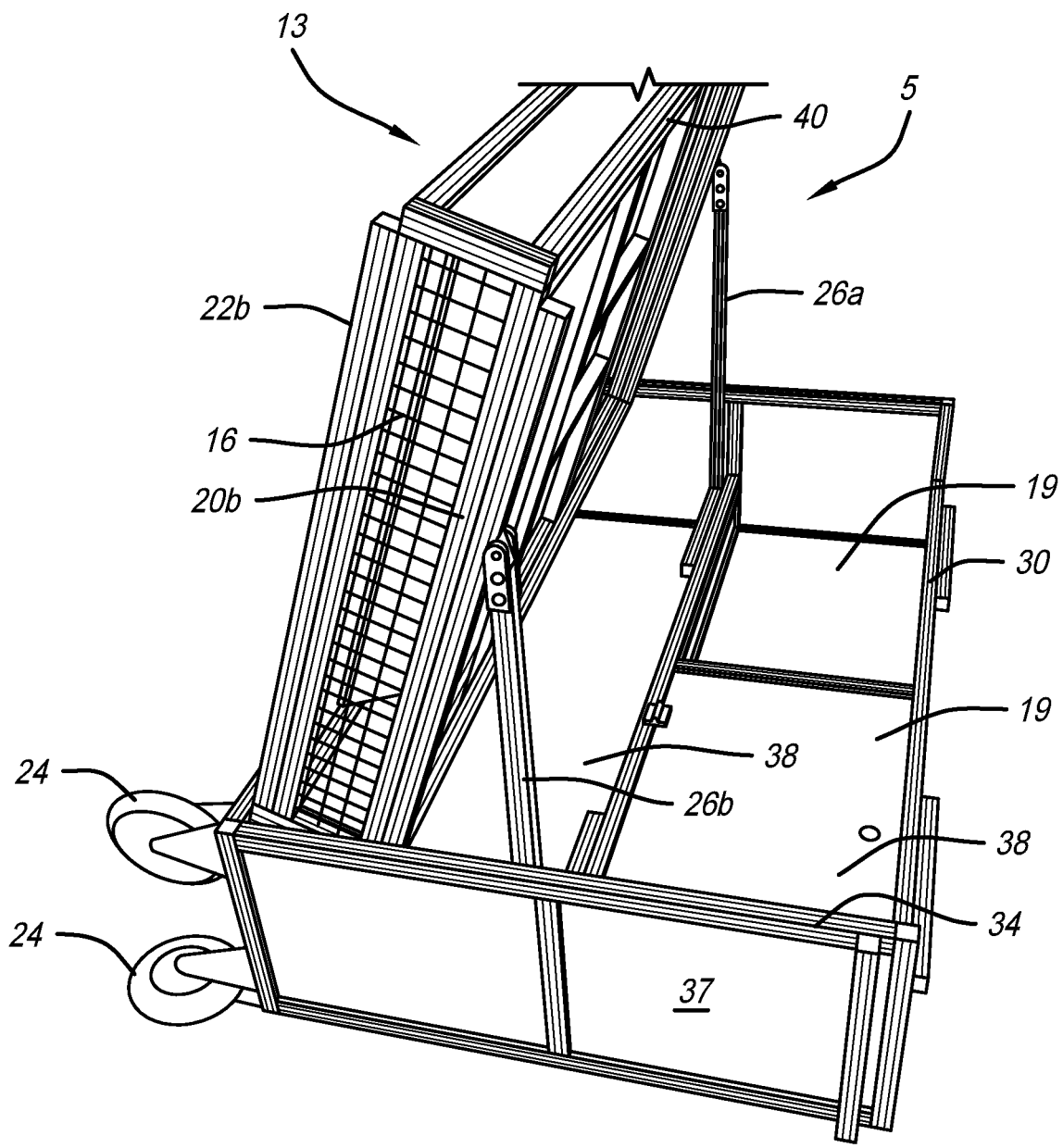
FIG. 3 is a perspective side view of the portable video display system of FIG. 1 showing the case in the open position with the display monitor deployed.
Figure 4:
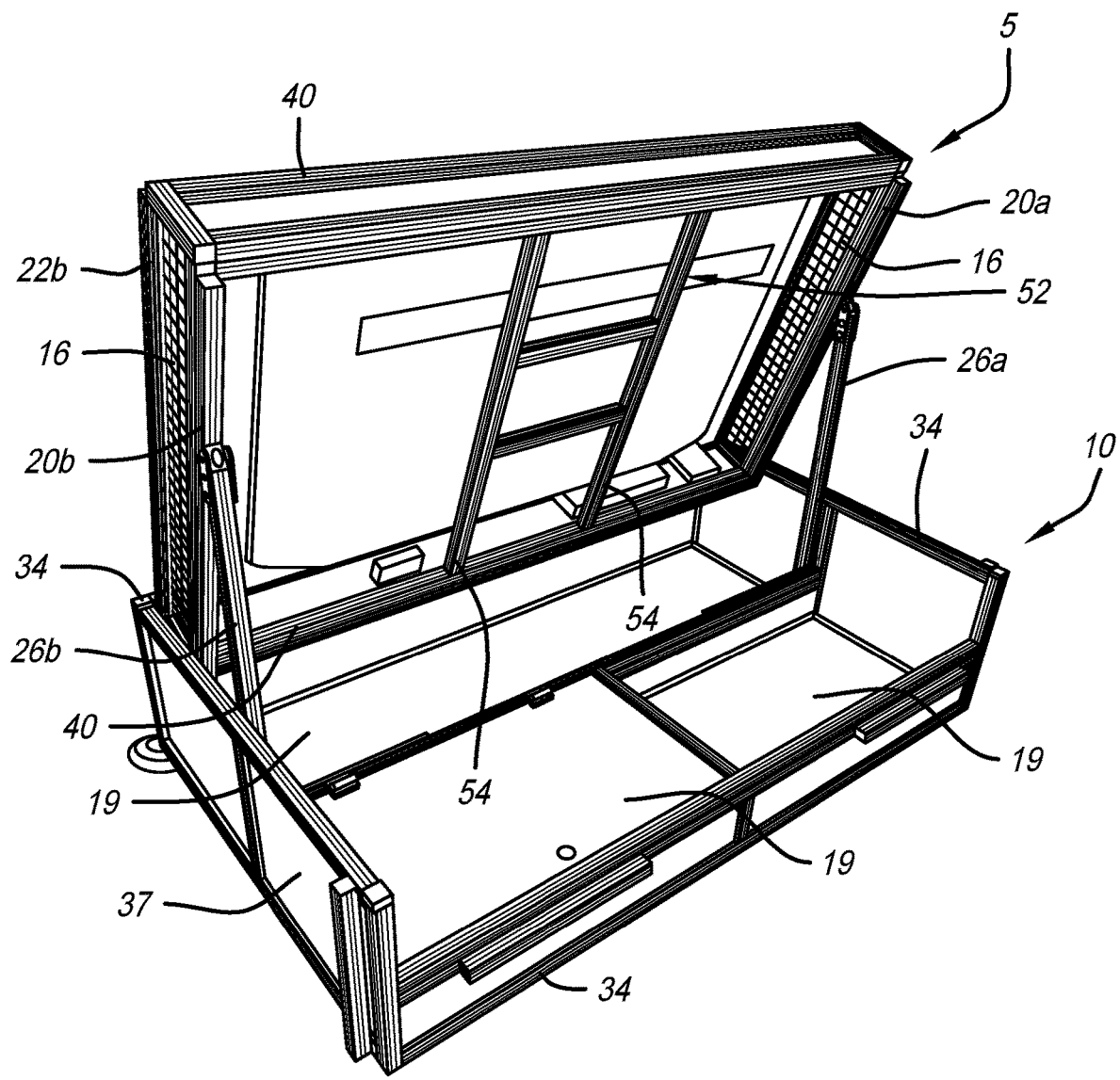
FIG. 4 is perspective rear view of the portable video display system of FIG. 1 with a removable protective panel removed to reveal the rear of the monitor and also showing storage compartments of the case.
Figure 6:
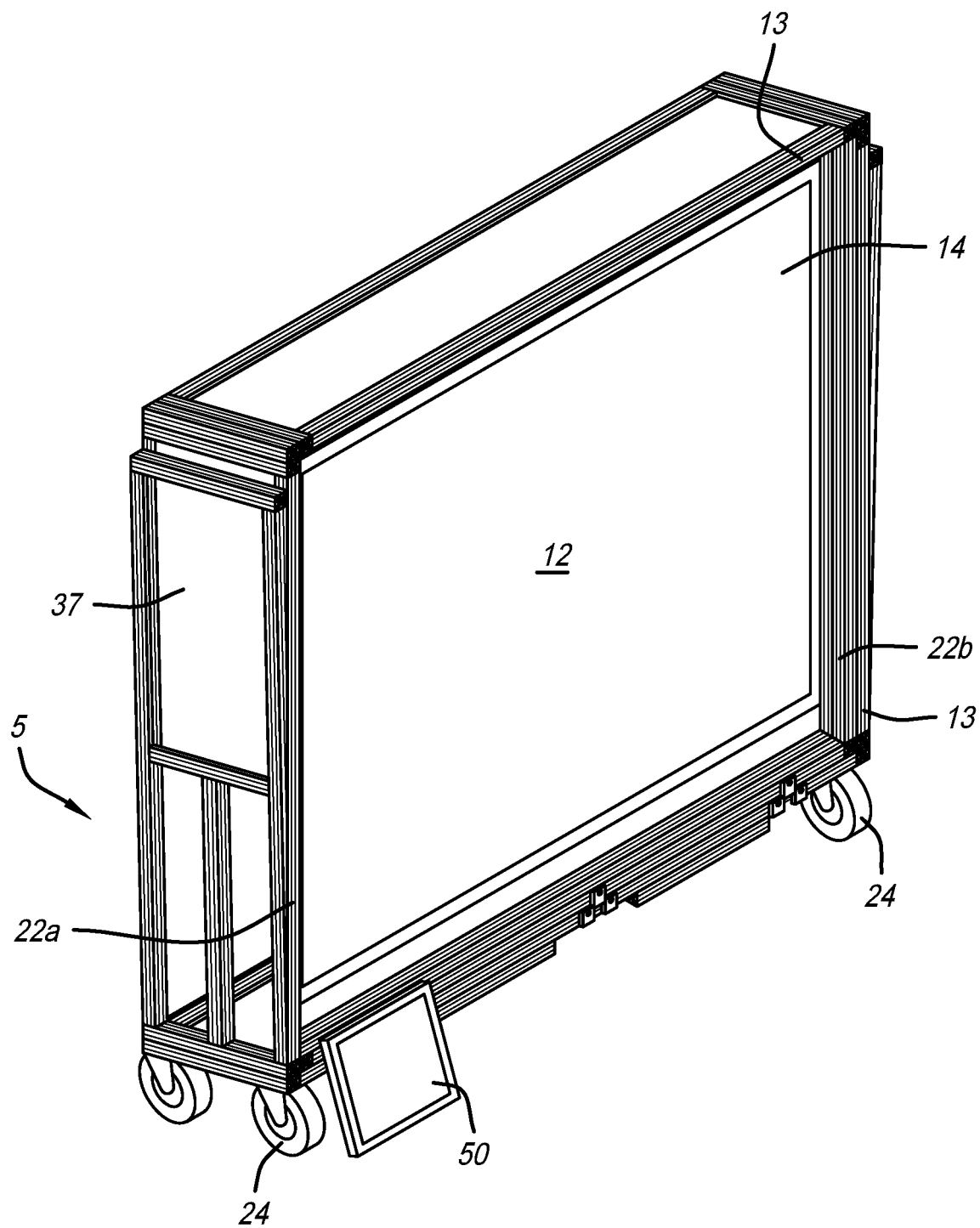
FIG. 6 is a perspective view of the portable video display system of FIG. 1 shown in the closed position and on its wheels for transportation, with the removable panel removed to reveal the screen of the display monitor.

As can be seen in FIGS. 1-2 and 6, a translucent shield 14 is mounted to the display support structure frame 40 so that it is positioned over the screen of the display monitor 12. The translucent shield 14 is made of a durable material, such as polycarbonate or acrylic, and protects the screen of the display monitor 12 from impacts, such as impacts from sideline hazards. The translucent shield 14 also can function as an overlay that can be marked with dry erase markers for video instructional purposes on the sideline during an athletic event or during practice. As can be seen in FIG. 4, the H-shaped frame portion 52 is connected to the display support structure frame 40 via lower rear hinges 54, which allow the display monitor 12 to be rotated inwardly and away from the translucent shield 14 to remove the display monitor 12 or to clean its screen.

Figure 7:
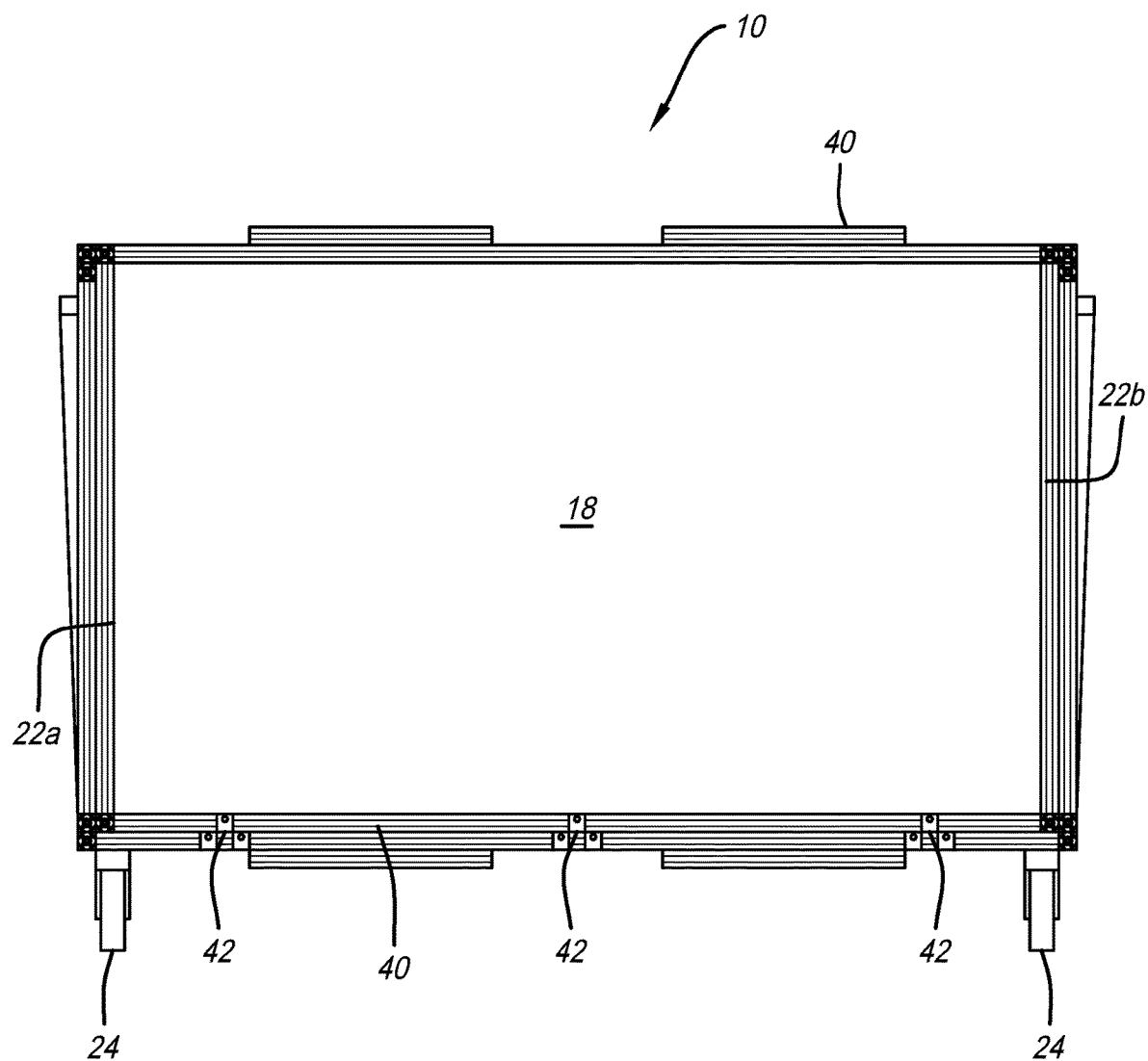
FIG. 7 is front view of the portable video display system of FIG. 1 shown in the closed position and on its wheels for transportation, with the removable panel inserted to protect the screen of the display monitor
Figure 8:
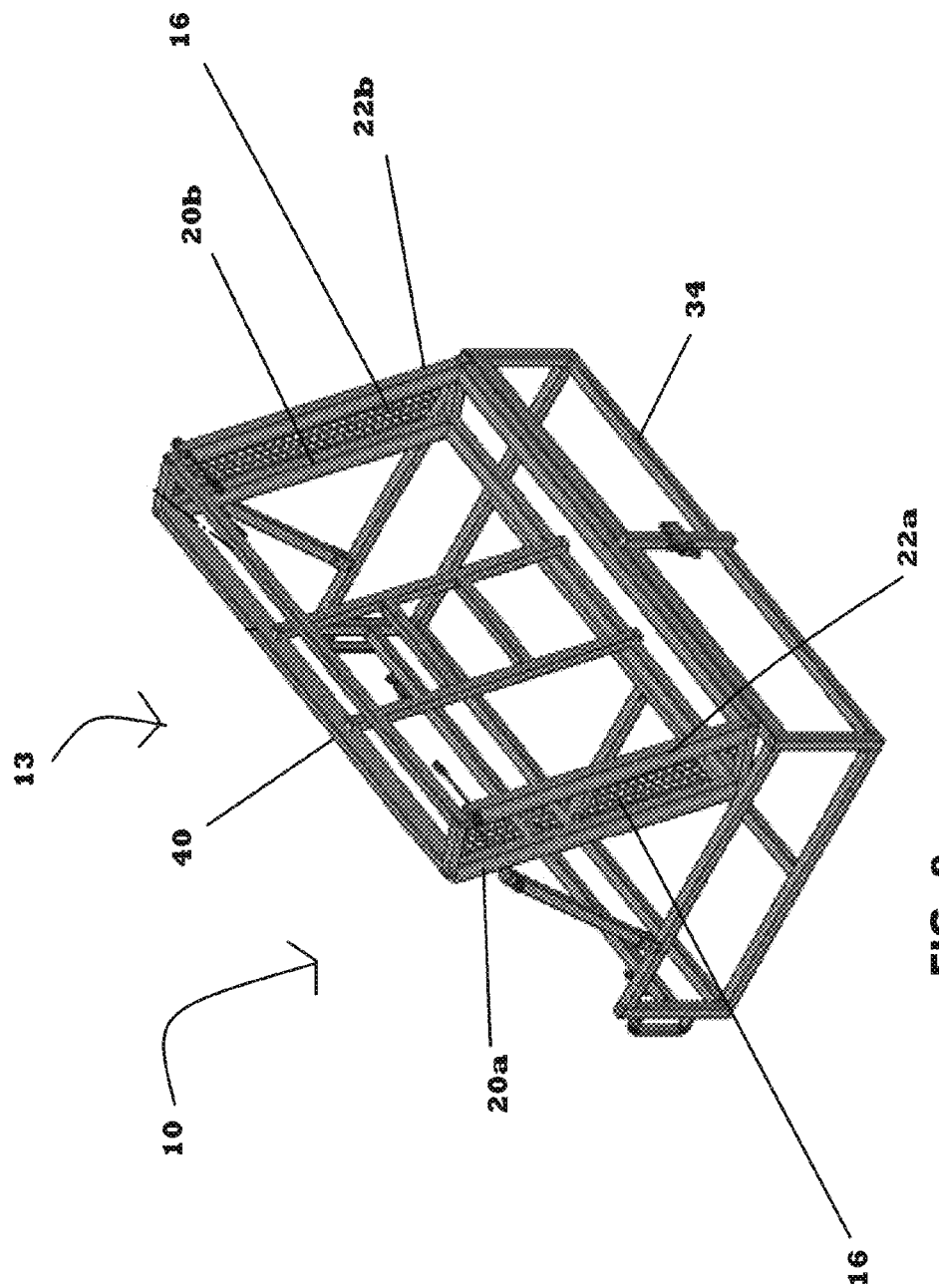
FIG. 8 is a perspective view of an embodiment of a frame assembly for a portable case according to the present invention.
Figure 9:
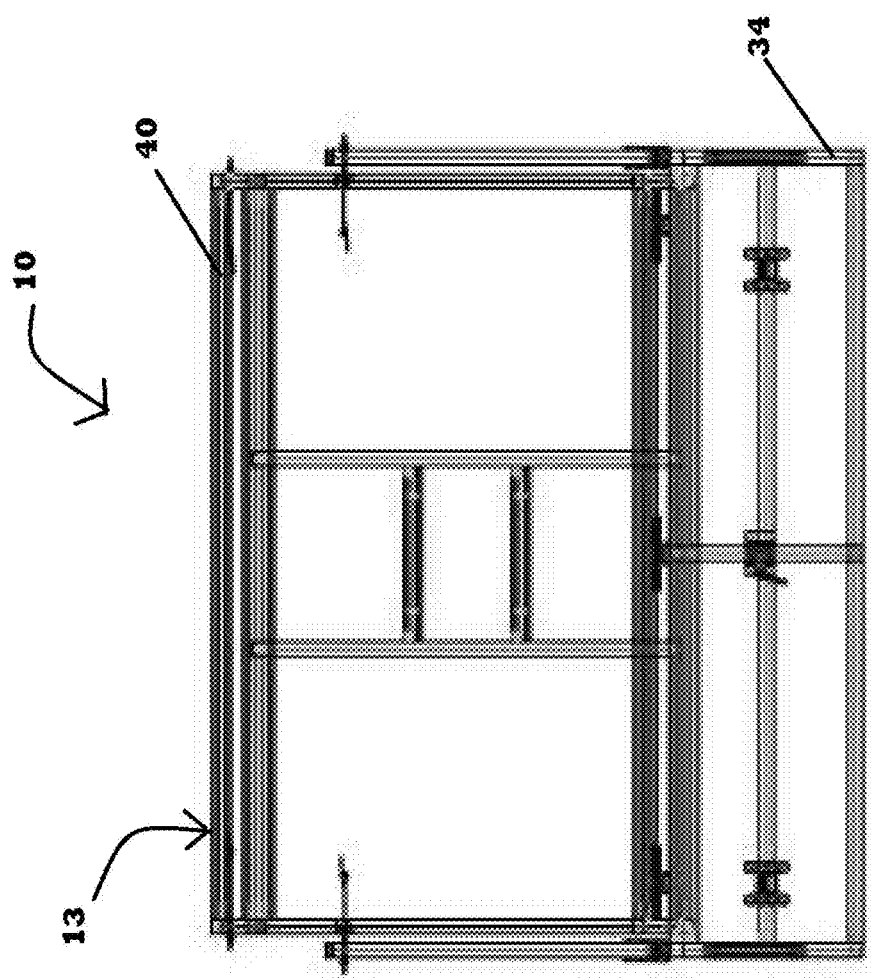
FIG. 9 is a front elevation view of the frame assembly of FIG. 7.
Figure 10:
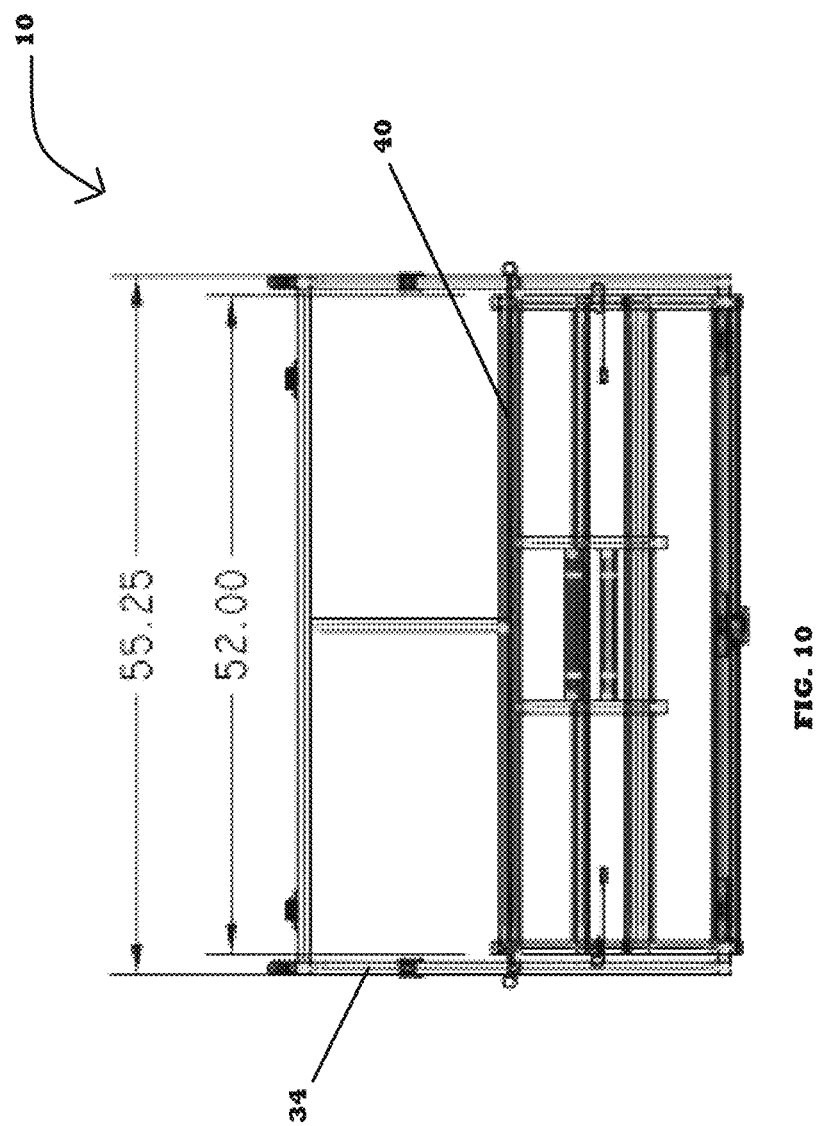
FIG. 10 is a top plan view of the frame assembly of FIG. 7.
Figure 11:
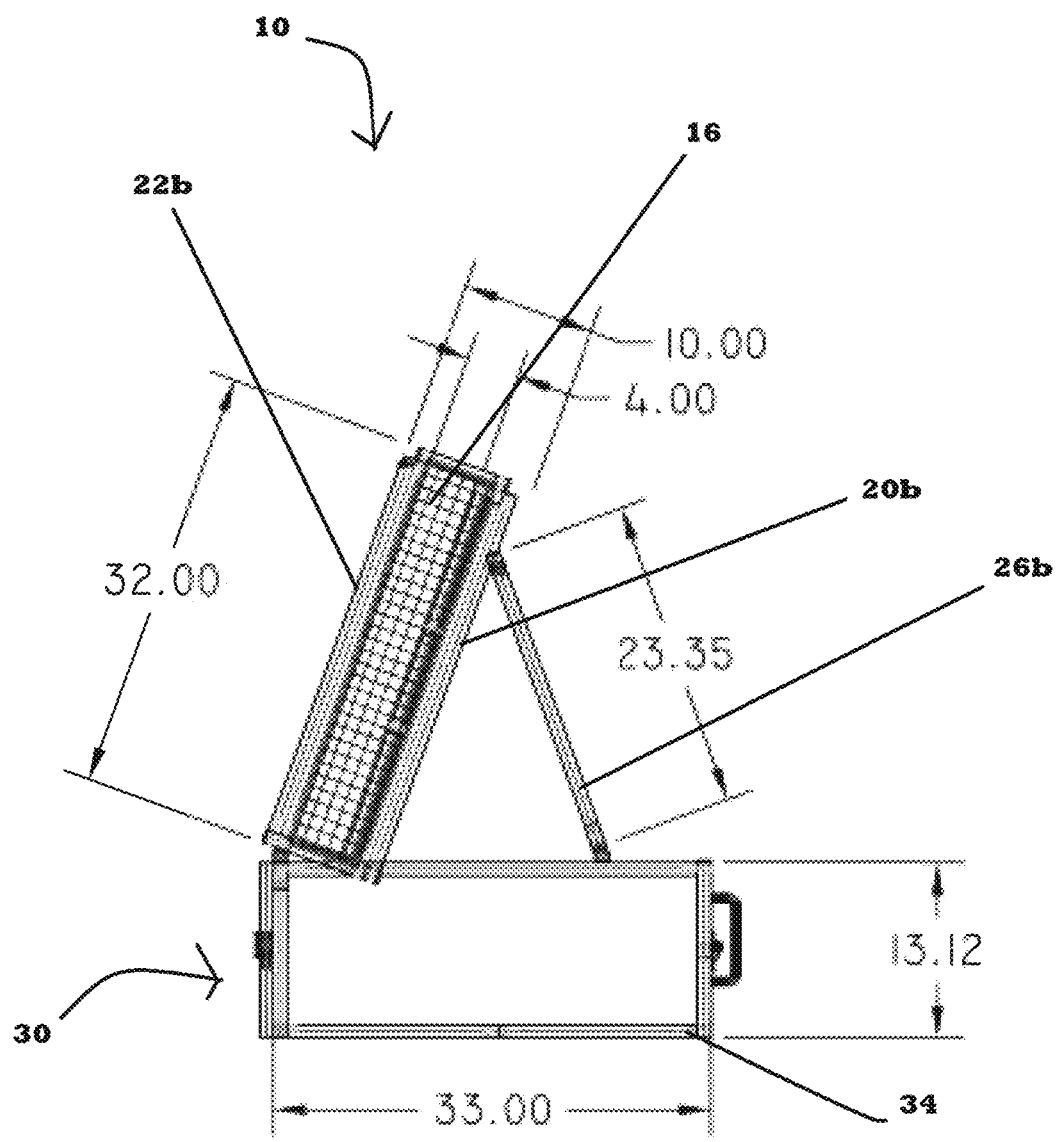
FIG. 11 is a side elevation view of the frame assembly of FIG. 7.

Each of the frame rear side members 20a, 20b and front track members 22a, 22b, includes an inwardly-facing channel sized to receive an edge of a removable panel 18. In this configuration the removable panel 18 can be slidingly inserted between the two opposing rear track members 20a, 20b to protect the rear of the display monitor 12 when it is deployed in the open position. Alternatively, the removable panel 18 can be slidingly inserted between the two opposing front track members 22a, 22b of the display support structure frame 40 to act as an outer panel that covers and protects the display monitor 12 (as shown in FIG. 7), such as during storage and transportation of the video display system 5 when the display support structure 13 and display monitor 12 are in the closed position.

In some preferred embodiments, the portable video display system 5 includes electronic equipment that can operate with known instant replay systems to enable coaches and players to watch instant replay during an athletic event. A few examples of such instant replay systems include the Hudl Sideline® system marketed by Agile Sports Technologies, Inc., the Echo1612 system marketed by echo1612, Inc., and the SkyCoach® system marketed by SkyCoach, LLC. For example, as shown in FIGS. 1 and 2, some embodiments can include a removable antenna mount 44 for one or more antennas 46 that can be used to communicate with such systems. Also, the portable video display system 5 can be configured with suitable devices and technology to connect (either via a cable or wireless connection) with a mobile device 50 (such as a mobile phone, tablet, or laptop) to mirror or stream video content from the mobile device to display monitor 12. Such devices/technologies can include, for example, Apple TV, Apple AirPlay, Microsoft Wireless Display Adapter, and Miracast, and a personal computer.

Figure 5:
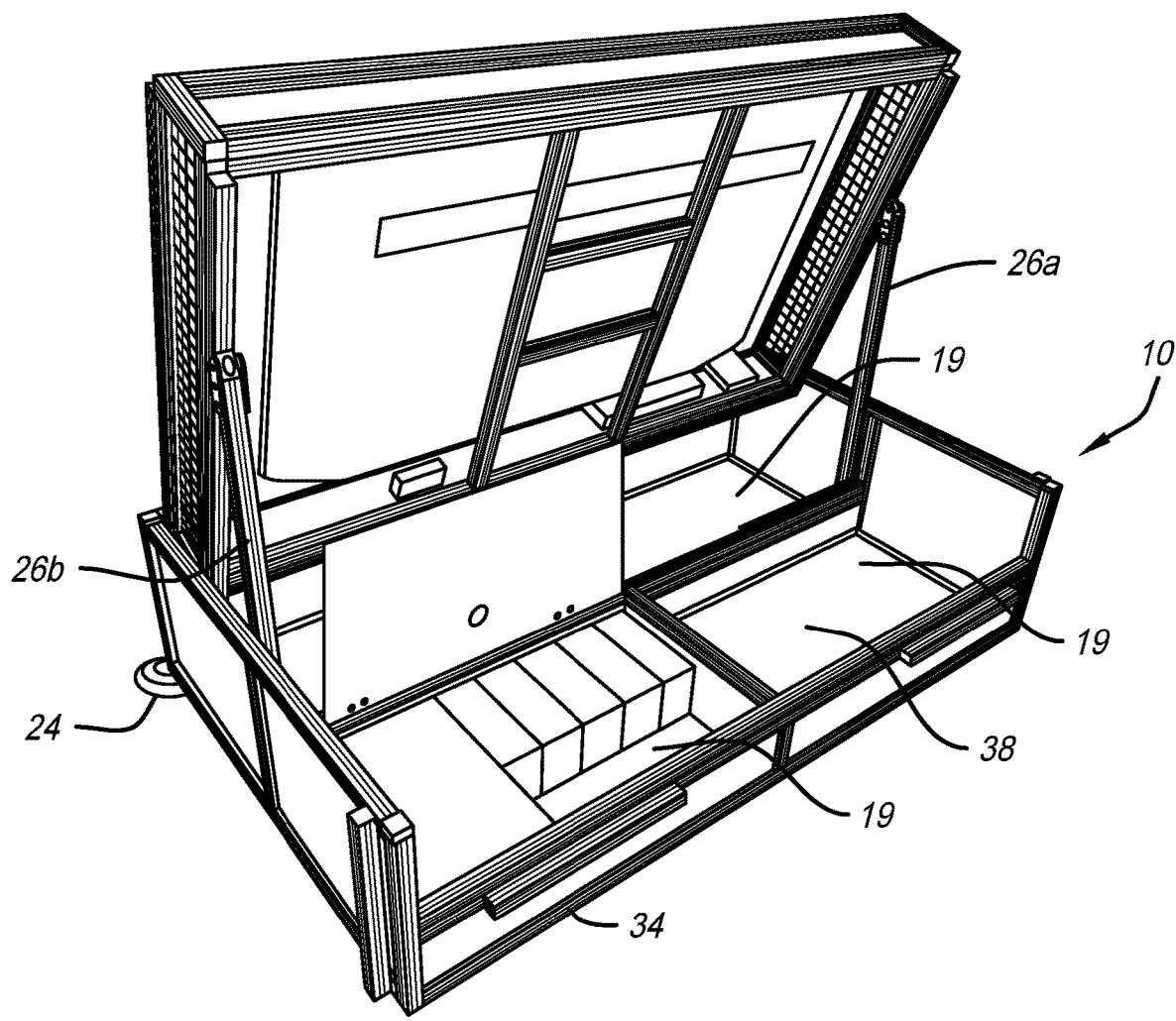
FIG. 5 is a perspective rear view of the portable video display system of FIG. 1 showing more detail of the case storage compartments.

As can be seen in FIGS. 4-5, the portable case 10 also can include multiple interior compartments 19 for storing equipment or other loose items. In some embodiments, one or more of the compartments 19 can be insulated so that they can be used to store cold drinks or hot food items. Such insulation can be accomplished by lining the compartment with an insulating material.

FIGS. 8-11 illustrate one exemplary embodiment of a frame assembly of a portable case according to the present invention for a portable video display system configured for displaying instant replay video on the sideline of a football game. The portable display video system is sized to contain and protect a large screen TV of up to 50". In practice, the system can be set up for use in under five minutes.

From the foregoing, it can be seen that a portable video display system according to the present invention provides a number of benefits not previously provided by the prior art. It is an easily transportable, physically stable and protected system that can be set up for use in a short period of time. It can include a large screen video display for providing video instruction, such as for reviewing instant replay with a group of players on the sideline during an athletic event.

Upon reading this disclosure, those skilled in the art will appreciate that various changes and modifications may be made to the preferred embodiments of the invention and that such changes and modifications may be made without departing from the spirit of the invention. Therefore, the invention in its broader aspects is not limited to the specific details, representative devices, and illustrative examples shown and described. Accordingly, departures may be made from such details without departing from the spirit or scope of the general inventive concept.

What is claimed is:

1. A portable case for a video display apparatus, the case comprising:
   a base container that defines a case interior space; and
   a display support structure coupled to the base container and configured to be moved between: (i) a closed position wherein at least a portion of the display support structure is stored within the case interior space; and (ii) an open position wherein at least a portion of the display support structure is in a deployed position outside of the case interior space and wherein the base container supports the display support structure in the deployed position;
   wherein the display support structure is configured to protect a display monitor when the display support structure is in the open position, and the display support structure includes a translucent shield configured to be positioned in front of at least a portion of a viewing screen of the display monitor.

2. The portable case of claim 1 wherein the display support structure is configured to receive a removable panel.

3. The portable case of claim 2 wherein the display support structure includes a frame having a rear track adapted to slidingly receive the removable panel when the display support structure is in the open position.

4. The portable case of claim 2 wherein the display support structure includes a frame having a front track adapted to slidingly receive the removable panel when the display support structure is in the closed position.

5. The portable case of claim 1 wherein the translucent shield comprises a material suitable as a monitor overlay that can be marked with an erasable marker.

6. The portable case of claim 1 wherein the display support structure is hingedly coupled to base container.

7. The portable case of claim 1 wherein the interior space comprises one or more storage compartments.

8. The portable case of claim 1 wherein the case interior space is configured to store electronics configured to operate with an instant replay system to enable a viewer of the deployed monitor to watch instant replay during an athletic event.

9. The portable case of claim 1 wherein the display support structure further comprises an enclosure frame, at least one side panel, and a removable panel that can be slidingly inserted into a rear track member of the enclosure frame to protect the rear of a display monitor positioned within the enclosure frame.

10. The portable case of claim 1 further comprising wheels mounted to a side of the base container.

11. A portable video display system comprising:
   a base container that defines a case interior space; and
   a display monitor mounted to a display support structure and including a viewing screen;
   wherein the display support structure is coupled to the base container and is configured to be moved between;
   (i) a closed position wherein the display monitor is stored within the case interior space; and (ii) an open position wherein the display monitor is in a deployed position outside of the case interior space and the base container supports the display support structure in the deployed position;
   wherein when the display support structure is in the open position, the display support structure is configured to provide a protective enclosure for the display monitor; and
   wherein the display support structure includes a translucent shield positioned in front of at least a portion of the viewing screen of the display monitor.

12. The portable video display system of claim 11 wherein the display support structure is configured to receive a removable panel.

13. The portable video display system of claim 12 wherein the display support structure includes a frame having a rear track adapted to slidingly receive the removable panel when the display support structure is in the open position.

14. The portable video display system of claim 12 wherein the display support structure includes a frame having a front track adapted to slidingly receive the removable panel when the display support structure is in the closed position.

15. The portable video display system of claim 11 wherein the translucent shield comprises a material suitable as a monitor overlay that can be marked with an erasable marker.

16. The portable case of claim 11 wherein the display support structure is hingedly coupled to base container.

17. The portable case of claim 11 wherein the case interior space comprises one or more storage compartments.

18. The portable video display system of claim 11 wherein the case interior space is configured to store electronics configured to operate with an instant replay system to enable a viewer of the deployed monitor to watch instant replay during an athletic event.

19. The portable video display system of claim 11 wherein the display support structure further comprises an enclosure frame, side panels, and a removable panel that can be slidingly inserted into rear tracks of the enclosure frame to protect the rear of a display monitor positioned within the enclosure frame.

20. The portable video display system of claim 11 further comprising wheels mounted to a side of the base container.

* * * * *